United States Patent [19]
Donohue

[11] Patent Number: 6,064,273
[45] Date of Patent: May 16, 2000

[54] PHASE-LOCKED LOOP HAVING FILTER WITH WIDE AND NARROW BANDWIDTH MODES

[75] Inventor: John E. Donohue, Ridgefield, Conn.

[73] Assignee: ADC Telecommunications, Minnetonka, Minn.

[21] Appl. No.: 09/090,632

[22] Filed: Jun. 4, 1998

[51] Int. Cl.[7] .................................................. H03L 7/093
[52] U.S. Cl. .................................................. 331/17; 331/25
[58] Field of Search ................................. 331/17, 25

[56] References Cited

U.S. PATENT DOCUMENTS

| | | | |
|---|---|---|---|
| 3,316,497 | 4/1967 | Brooks | 331/17 |
| 3,363,194 | 1/1968 | Hileman | 331/17 |
| 3,993,958 | 11/1976 | Cutsogeorge | 328/109 |
| 4,131,862 | 12/1978 | Black et al. | 331/17 |
| 4,400,667 | 8/1983 | Belkin | 331/1 A |
| 4,433,308 | 2/1984 | Hirata | 331/17 |
| 4,482,869 | 11/1984 | Hirata | 331/4 |
| 4,885,553 | 12/1989 | Hietala et al. | 331/17 |
| 4,998,163 | 3/1991 | Salvati | 358/42 |
| 5,091,702 | 2/1992 | Foell | 331/4 |
| 5,181,138 | 1/1993 | Davis et al. | 359/239 |
| 5,241,285 | 8/1993 | Jackson | 331/1 A |
| 5,402,425 | 3/1995 | Bladh | 370/105.3 |
| 5,686,866 | 11/1997 | Badger | 331/17 |

FOREIGN PATENT DOCUMENTS

| | | | |
|---|---|---|---|
| 56-104544 | 8/1981 | Japan | H03L 7/10 |
| 92/01344 | 7/1990 | WIPO | H04J 3/002 |

OTHER PUBLICATIONS

Liebold, R., "Verbesserung des Einrastverhaltens von Phasenregelkreisen", *Radio Fernsehen Elektronik*, vol. 32, No. 4, XP002113868, 262, (1983).

*Primary Examiner*—Siegfried H. Grimm
*Attorney, Agent, or Firm*—Schwegman, Lundberg, Woessner & Kluth, P.A.

[57] ABSTRACT

A phase-locked loop utilizes a pair of diodes in a loop filter design for providing fast acquisition of a reference signal during an acquisition mode, while maintaining a more narrow bandwidth in a locked mode of operation. During the acquisition mode, the diodes are conducting and the loop filter bandwidth is wide, which provides for a faster response time. As the reference signal is acquired, the diodes no longer conduct and the loop filter bandwidth becomes more narrow for tracking the reference signal.

15 Claims, 3 Drawing Sheets

PHASE-LOCKED LOOP HAVING FILTER WITH WIDE AND NARROW BANDWIDTH MODES

TECHNICAL FIELD OF THE INVENTION

The present invention relates generally to electronic circuits and in particular to a phase-locked loop with an improved loop filter.

BACKGROUND OF THE INVENTION

A phase-locked loop (PLL) is a system that uses feedback to maintain an output signal in a specific relationship with a reference signal. Typically, a phase-locked loop contains a phase detector, a loop filter and a voltage-controlled oscillator (VCO). Phase-locked loops are used in many areas of electronics to control the frequency and/or phase of a signal. Applications include frequency synthesizers, modulators, demodulators and clock recovery circuits.

A typical phase-locked loop has three operational modes: 1) a free running mode, wherein no reference input signal is applied to the phase detector; 2) a capture or acquisition mode, wherein an output signal from the voltage controlled oscillator is different from the reference input signal and the voltage controlled oscillator is in the process of continually changing a phase of its output signal until the output signal maintains the same phase as the referenced input signal;and 3) a locked mode, wherein the voltage controlled oscillator output signal tracks and varies exactly with the phase of the reference input signal.

In the capture or acquisition mode, a loop filter having a wide bandwidth is preferred because it has a faster acquisition time for acquiring the reference input signal. Once the reference input signal is acquired, a narrower bandwidth is preferred for the locked mode of operation. Therefore, during the acquisition mode the loop bandwidth should be made as wide as possible to maintain good tracking and acquisition properties, and in the locked mode the loop bandwidth should be made as narrow as possible to minimize phase jitter in an output signal from the voltage controlled oscillator.

The need for a loop filter having both a wide bandwidth and a narrow bandwidth presents a problem because design criteria for the loop filter changes depending on the mode of operation, e.g., acquisition mode or locked mode.

The need for varying the requirements of a loop filter bandwidth is illustrated when a phase-locked loop is utilized to function as a band pass filter. Computer aided ranging systems often utilize phase-locked loops in such a manner. It is desirable that the phase-locked loop acquire a signal as quickly as possible to conserve computer time. Accordingly, during the acquisition mode of operation, the time constant of the phase-locked loop filter must be as short as possible and the bandwidth, therefore, as wide, as possible. However, for the phase-locked loop to properly perform the friction of a bandpass filter, a predetermined loop bandwidth must be maintained during the locked state. A bandwidth in the locked mode of operation is typically less than the bandwidth in the acquisition mode of operation.

One approach to solving the problem of loop filter bandwidth has been to utilize a "passive loop filter" that includes first and second resistors and a capacitor serially connected between the input terminal of the loop filter and ground. Two oppositely poled diodes are connected in parallel across the first resistor. The output signal of the phase comparator is applied to the first resistor and the output signal of the loop filter is taken across the second resistor and capacitor. During the acquisition mode a differential voltage exists across the diodes and current flows through the diodes. The first resistor is thus bypassed and, in effect, removed from the filter. When phase-lock is reached, an equipotential exists across the diodes, and the diodes accordingly become non-conductive. The first resistor is thereby made a factor in determining the time constant of the loop filter. During the locked mode, the phase-locked loop maintains a predetermined narrow bandwidth and, during the acquisition mode when the first resistor is not a factor in determining the loop filter time constant, the loop bandwidth is broadened to achieve faster acquisition.

However, the "passive loop filter" is not suitable for use in various types of PLL's. For example, it is desirable to have a PLL which locks on frequency as well as phase, and one that will not falsely "lock" onto reference input signals that are close to harmonics of the VCO center frequency.

Similar methods have been offered to provide different time constants corresponding to the modes of operation, but such methods have their own shortcomings. . For example, U.S. Pat. No. 3,993,958 issued to Cutsogeorge, discusses a loop filter circuit for speeding acquisition in a phase-locked loop by utilizing two resistor-capacitor filter circuits interconnected by a pair of diodes. Each filter circuit has a different time constant. However, the approach taken in the '958 patent only works with analog phase detectors. If the teachings were applied to a digital, comparator-type phase detector, the output pulses from the phase detector would be coupled directly into the VCO input by the diodes yielding undesirable instability in the circuit.

What is needed is a more versatile phase-locked loop system that allows for the fast acquisition of analog and digital reference input signals and a phase-locked loop system that provides a more narrow bandwidth signal to the VCO once the signal has been acquired. For the reasons stated above, and for other reasons stated below which will become apparent to those skilled in the art upon reading and understanding the present specification, there is a need in the art for a phase-locked loop system having an improved loop filter design for optimizing performance in an acquisition mode and a locked mode of operation.

SUMMARY OF THE INVENTION

A phase-locked loop utilizes an interconnecting network for providing at least two current paths in a loop filter design for providing fast acquisition of a reference input signal during an acquisition mode, while maintaining a more narrow bandwidth in a locked mode of operation. The interconnecting network is a resistor having a pair of oppositely poled diodes in parallel across the resistor for effecting bandwidth characteristics of the loop filter. During the acquisition mode, the diodes are conducting and the loop filter bandwidth is wide, which provides for a fast response time. As the reference input signal is acquired, the diodes no longer conduct and the loop filter bandwidth becomes more narrow for tracking the reference input signal. The phase-locked loop is compatible with analog and digital input signals. Implementation of the diodes support both passive and active loop filter designs. An active loop filter design allows gain to be added to a feedback loop for producing particular loop characteristics.

In one embodiment a phase-locked loop system comprises a phase detector responsive to an input signal and a feedback signal, a loop filter coupled to the phase detector for receiving and filtering an output signal from the phase detector, and a voltage controlled oscillator for receiving a direct current output signal from the loop filter and for providing the feed-back signal. The loop filter further comprises a first filter section and a second filter section coupled to the first filter section via an interconnecting resistor, wherein the resistor has a pair of oppositely poled diodes in parallel across the resistor for effecting bandwidth characteristics of the loop filter such that the loop filter operates at a wide bandwidth during an acquisition mode of operation and at a predetermined narrow bandwidth in a locked mode of operation. The loop filter may be either a passive or active network.

An advantage of utilizing a loop filter design having an interconnecting network for providing at least two current paths is that the loop filter supports two different bandwidths; a wide bandwidth (fast response time) is provided in the acquisition mode of the phase-locked loop and a more narrow bandwidth (slow response time) is provided once the signal has been acquired. Because the loop filter comprises a first and second filter section, the diodes cause the overall loop filter characteristics to vary depending upon the mode of operation. For instance, the diodes cause the second filter section to charge up more quickly as compared to not having the diodes within the loop filter design. Once the second filter charges up, the diodes are turned off and the loop filter functions as a predefined narrow bandwidth filter for tracking the reference input signal.

Therefore, a phase-locked loop with an improved loop filter allows for the fast acquisition of a reference input signal during an acquisition mode, while maintaining a more narrow bandwidth in a locked mode of operation. In different embodiments of the invention varying resistance and capacitance values, and loop filter designs of varying scope are described. For instance, the improved filter design is applicable to both passive and active loop filters. Still other and further embodiments, aspects and advantages of the invention will become apparent by reference to the drawings and by reading the following detailed description.

DETAILED DESCRIPTION OF THE INVENTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Figure 1:
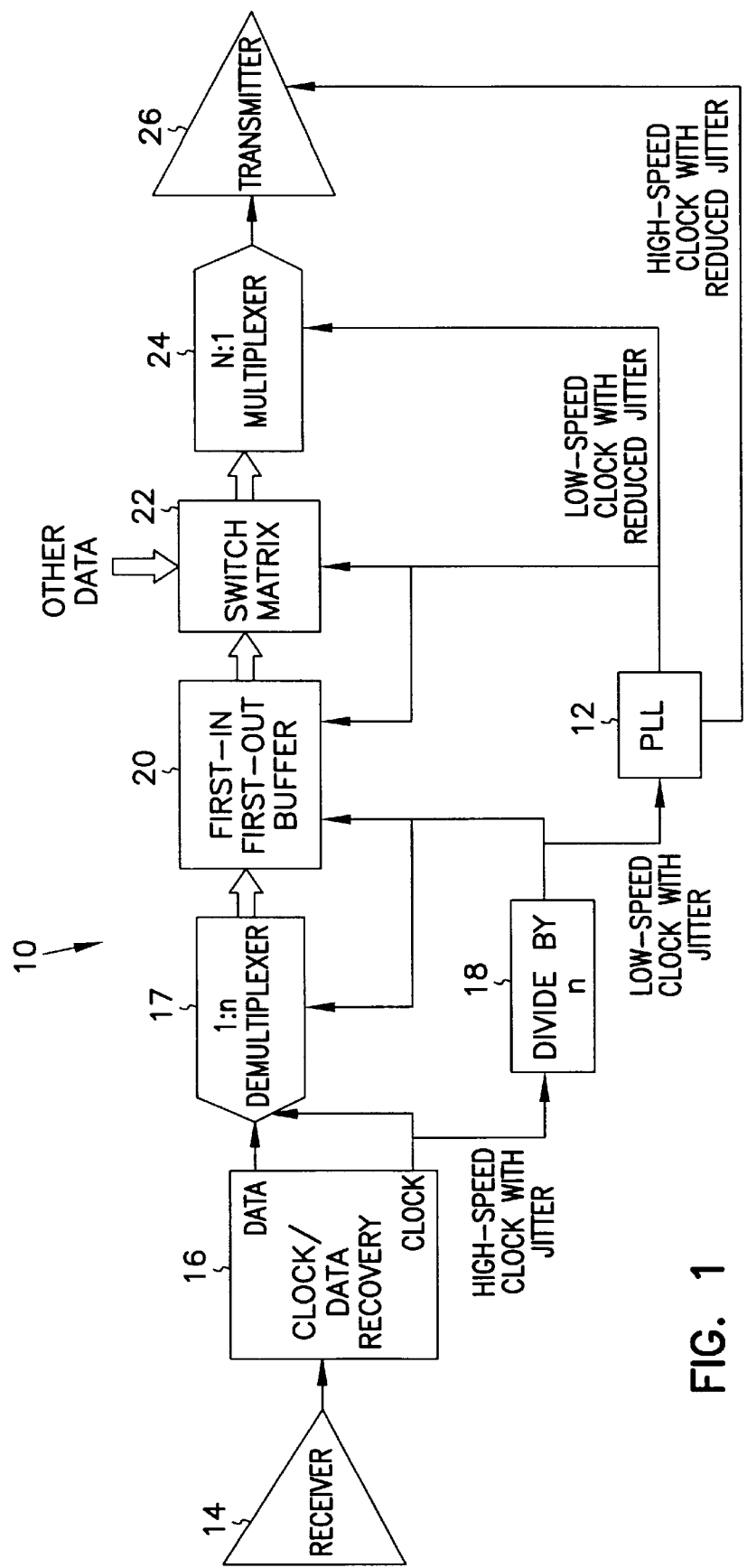
FIG. 1 is a block diagram of an embodiment of a digital communication system utilizing a phase-locked loop according to the teachings of the present invention.

Phase-locked loops are used in many applications including frequency synthesis, modulation, demodulation and clock recovery. FIG. 1 is a block diagram of an embodiment of a digital communication system 10 utilizing a phase-locked loop 12 according to the teachings of the present invention. In digital communications it is frequently necessary to extract a coherent clock signal from an input data stream. Once the clock signal has been extracted, a phase-locked loop 12 is often used to remove jitter present within the signal.

A receiver 14 receives an input signal containing both a data signal and a clock signal. The clock signal is at high speed and often contains jitter. Depending on the type of data encoding used, the data signal and the clock signal are separated by a clock/data recovery unit 16. Both the high-speed clock signal having jitter and the received data signal are applied to a demultiplexer 17.

The high speed clock signal containing jitter is also applied to an input of a frequency divider 18 to reduce the frequency of the clock signal. An output from the frequency divider 18 provides a low-speed clock signal containing jitter. This signal is applied to an input of the phase-locked loop 12. The phase-locked loop 12 reduces the jitter by filtering the clock signal through a loop filter contained within the phase-locked loop 12. This loop filter contains a first filter section and a second filter section coupled together via an interconnecting resistor. This resistor has a pair of oppositely poled diodes in parallel across the resistor for effecting bandwidth characteristics of the loop filter such that the loop filter operates at a wide bandwidth during an acquisition mode of operation and the loop filter operates at a predetermined narrow bandwidth in a locked mode of operation. An output signal from the loop filter is applied to a voltage controlled oscillator for providing a feedback signal back to the loop filter via a phase comparator. Detailed discussion of an embodiment of a phase-locked loop 12 along with desired characteristics of the loop filter in accordance with the teachings of the present invention are addressed when reference is made to FIG. 2.

A first output of the phase-locked loop 12 simultaneously applies a low-speed clock signal with reduced jitter to a first-in first-out buffer 20, a switch matrix 22 and a multiplexer 24. A transmitter 26 also receives a clock signal with reduced jitter from the phase-locked loop 12, but the clock speed remains at high-speed. Utilization of a clock signal with reduced jitter in a digital communication system 10 is well known to one skilled in the art and will not be discussed in any further detail herein.

Figure 2:
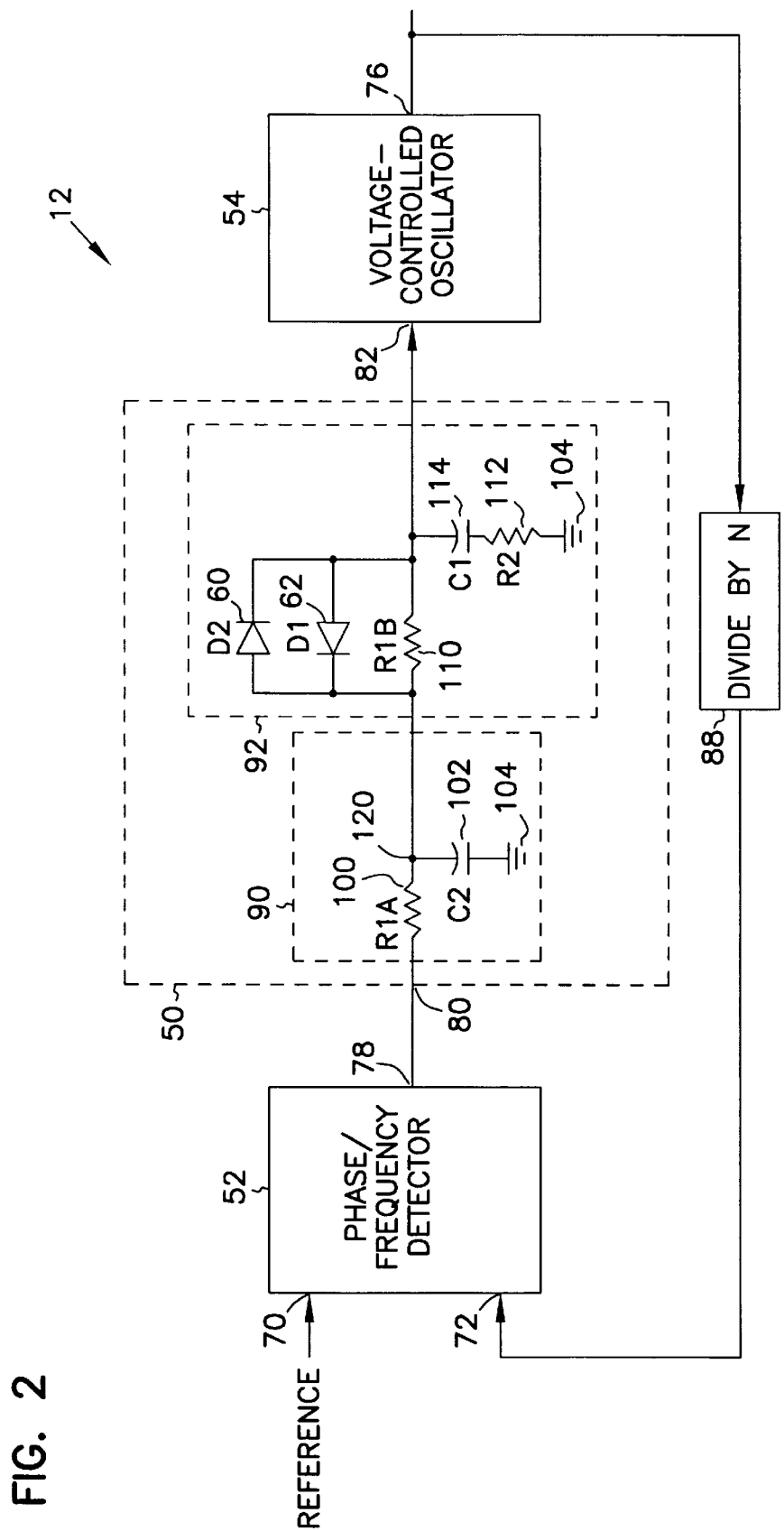
FIG. 2 is block diagram of an embodiment of a phase-locked loop with a passive loop filter according to the teachings of the present invention.

FIG. 2 is block diagram of one embodiment of a phase-locked loop 12 having a passive loop filter 50 according to the teachings of the present invention. The phase-locked loop 12 comprises three central components: a phase detector 52, a loop filter 50 and a voltage controlled oscillator 54. A pair of diodes 60, 62 are utilized by the loop filter 50 for providing fast acquisition of a reference input signal during an acquisition mode while maintaining a more narrow bandwidth in a locked mode of operation. During the acquisition mode, one of the diodes 60, 62 is conducting and the loop filter bandwidth is wide, which provides for a faster response time. Only one diode conducts at a time in order to support the polarity of a control voltage to be applied to the voltage controlled oscillator 54. As the reference input signal is acquired, the conducting diode 60, 62 is turned off and the loop filter bandwidth becomes more narrow for tracking the reference input signal. A more detailed discussion on the effects that the diodes 60, 62 have on the loop filter 50 is provided below.

The phase detector 52 has a first input 70 for receiving a reference input signal and a second input 72 for receiving a feed-back signal from an output 76 of the voltage controlled oscillator 54. Reference input signals are typically analog signals or digital square wave signals. An output 78 of the phase detector 52 provides a signal with average value proportional to the phase and/or frequency difference between the reference input signal applied to input 70 and the feed-back signal applied to input 72. The phase-detector output signal comprises a pulse train, in the case of a digital phase detector. In the case of an analog phase detector, the output comprises a DC level with superimposed sine waves. This output signal from the phase detector 52 is applied to input 80 of the loop filter 50.

The loop filter 50 filters the phase detector output and provides a DC output signal that is applied to input 82 of the voltage controlled oscillator 54. The voltage controlled oscillator 54 provides an output signal (which includes the feedback signal) at output 76, wherein the frequency of this output signal is proportional to the output signal of the loop filter 50.

Applying the feed-back signal from output 76 of the voltage controlled oscillator 54 to input 72 of the phase detector 52 allows the voltage-controlled oscillator 54 to generate an output signal at output 76 that is in phase and/or frequency lock with the reference input signal applied to input 70. A direct connection of this feedback signal establishes a 1:1 phase-locked loop. A connection through a frequency divider 88 (divide by N) enables generation of frequency multiples. The frequency is an integer multiple of the frequency of the referenced input signal applied to input 70.

Loop filter 50 comprises a first filter section 90 and a second filter section 92. The first filter section 90 comprises a first resistor 100 and a first capacitor 102 having values R1A and C2, respectively. The first resistor 100 and the first capacitor 102 are serially connected between input 80 and ground 104. The second filter section 92 further comprises a second resistor 110, a third resistor 112 and a second capacitor 114 having values R1B, R2 and C1, respectively. The second resistor 110, the second capacitor 114 and the third resistor 112 are serially connected between terminal 120 and ground 104. Diodes 60 and 62 are connected in parallel, in an oppositely poled manner, across the second resistor 110. The diodes 60, 62 are oppositely faced so that the loop filter 50 can either quickly charge or discharge the second capacitor 114 depending on a polarity of a control voltage applied to the voltage controlled oscillator 54.

During an acquisition mode of operation, one of the diodes 60, 62 is conducting and the loop bandwidth becomes wider. The acquisition time is shorter during the initial stages of acquisition. Loop filter bandwidth and response time are inversely related. In other words, a wider bandwidth provides for a faster response time to acquire the reference input signal as compared to a narrow bandwidth filter. Once the phase-locked loop 12 locks onto the reference input signal, the diode 60 or 62 no longer conducts and the bandwidth changes to a predetermined narrow bandwidth for tracking the reference input signal.

For example, a 5 volt digital reference input signal is applied to input 80. During the initial acquisition mode, one of the diodes 60, 62 is conducting across resistor 110. Only one diode 60 or 62 conducts at a time in order to support the polarity of a control voltage to be applied to the voltage controlled oscillator 54. The conducting diode 60 or 62 across resistor 110 allows the first resistor 100 to be a factor in determining the response time of the first filter section 90. Accordingly, the first filter section 90 is charged to 5 volts via capacitor 102 while the output of the loop filter 50 remains at 0 volts. The values of resistor 110 and capacitor 102 are selected such that the bandwidth of the first filter section 90 is wide so that the response time to acquire the 5 volt reference input signal is faster as compared to a narrow bandwidth filter.

In order to speed up the time it would normally take to charge the second filter section 92, diodes 60, 62 are placed across resistor 110. After the 5 volt reference input signal is initially applied to the first filter section 90, one of the diodes 60, 62 begins to conduct in order to more quickly charge capacitor 114 in the second filter section 92. As the diode 60 or 62 is conducting it effectively places a short across resistor 110. This allows capacitor 114 to charge more quickly as compared to not having the diodes 60, 62 placed across the resistor 110. Only one diode 60 or 62 conducts at a time in order to support the polarity of a control voltage to be applied to the voltage controlled oscillator 54. The conducting diode 60 or 62 across resistor 110 allows the first resistor 100 to be a factor in determining the response time of the first filter section 90.

After the capacitor 114 is charged, the voltage across resistor 110 drops to nearly 0 volts which causes the conducting diode 60 or 62 to turn off. Once capacitor 114 is charged and both diodes 60, 62 are turned off, the 5 volt reference input signal has been acquired and the loop filter 50 now operates with a narrower bandwidth having a slower response time. This is due to the fact that the second capacitor 114 and resistor 110 now control the time constant of the loop filter 50.

The loop filter 50 thus provides a first bandwidth during an acquisition mode of the phase-locked loop 12 and a second bandwidth during a locked mode. The first bandwidth is wider than the second bandwidth to allow for fast acquisition of signals during the acquisition mode. A more narrow second bandwidth minimizes phase jitter in an output signal from the voltage controlled oscillator 54 since the signal has been reduced in bandwidth so as to prevent the introduction of noise.

Resistive and capacitance values of the resistors 100, 110 and 112 and the capacitors 102 and 114 are chosen such that the time constant of the first filter section 90 is much less than the time constant of the second filter section 92. Accordingly, the first filter section 90 has a much wider bandwidth than the second filter section 92. The time constant of the first filter section 90 is determined by the product of the resistance R1A of the resistor 100 and the capacitance C2 of capacitor 102. Similarly, the time constant of the second filter 92 is primarily determined by the sum of the resistance of resistors 100 and 110 (R1A and R1B, respectively) multiplied by the capacitance C1 of capacitor 114.

However, when one of the diodes 60, 62 is conducting it reduces the voltage drop across resistor 110 which allows resistor 100 to more quickly charge capacitor 114. When the diodes 60, 62 are not conducting, resistor 110 is more of a factor in determining the overall time constant of the loop filter 50. Accordingly, if resistance R1B of resistor 110 is set much larger than resistance R1A of resistor 100, and the capacitance C1 is set much larger than capacitance C2 of capacitor 102, the overall time constant of the loop filter 50 is determined by capacitance C1 and the combined resistance of R1A and R1B.

Therefore, to improve acquisition time of a reference input signal, R1A is set much smaller than R1B. Capacitance value C2 is set to be much smaller than capacitance value C1. Typically, the resistive value R2 is set much smaller than the combined resistive value of R1A and R1B.

The loop filter described with respect to FIG. 2, disregarding the effects of diodes 60 and 62, has a transfer function described by two poles and a zero. The lowest-frequency pole is determined by the values of R1A (100), R1B (110), and C1 (114). The frequency of the zero is determined by the values of C1 (114) and R2 (112). A high-frequency pole is provided by the values of R1A (100) and C2 (102).

When one of the diodes 60 or 62 is conducting, the transfer function still has two poles and a zero. The low-frequency pole is now determined by the values of R1A (100) and C1 only. The frequency of the zero is again given by the values of C1 and R2, and the high frequency pole by the values of R1A and C2. This allows the designer great flexibility in determining the loop dynamic behavior and stability margin, during both acquisition and locked modes.

Figure 3:
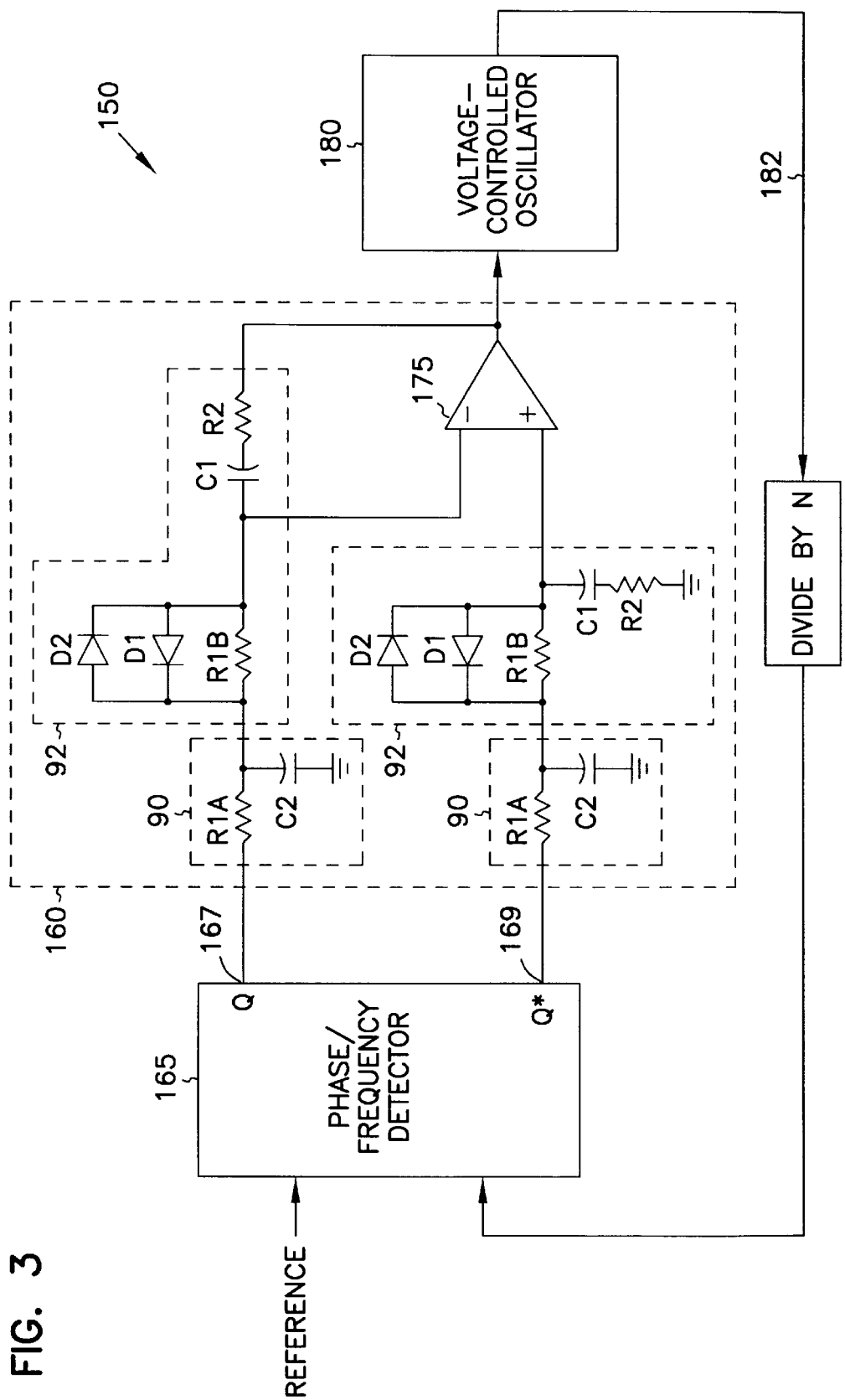
FIG. 3 is a block diagram of an embodiment of a phase-locked loop with an active loop filter according to the teachings of the present invention.

FIG. 3 is a block diagram of another embodiment of a phase-locked loop 150 with an active loop filter 160 according to the teachings of the present invention. The active loop filter 160 has similar characteristics as the passive loop filter 50 except that is has gain as well. The active loop filter 160 is used in situations where there are differential loop outputs 167, 169 from a phase detector 165 receiving a reference input signal. The active loop filter 160 takes the difference between signals present at the differential loop outputs 167, 169 and converts these signals to a single voltage output. Each signal is filtered through a first and second filter portions 90, 92 as discussed when reference was made to FIG. 2.

Because the active filter 160 has an amplifier 175, the voltage level of the signal can be shifted between the phase detector 165 and a voltage controlled oscillator 180. Alternatively, additional gain can be produced by amplifier 175 to produce particular loop characteristics.

Conclusion

A phase-locked loop 12 utilizing a pair of diodes 60, 62 in a loop filter design 50, 160 for providing fast acquisition of a reference input signal during an acquisition mode, while maintaining a more narrow bandwidth in a locked mode of operation has been described. During the acquisition mode, one of the diodes 60 or 62 is conducting and the loop filter bandwidth is wide, which provides for a fast response time. As the reference input signal is acquired, the diodes 60 ,62 no longer conduct and the loop filter bandwidth becomes more narrow for tracking the reference input signal. The phase-locked loop 12 is compatible with analog and digital input signals. Implementation of the diodes 60, 62 support both passive 50 and active 160 loop filter designs.

Although specific embodiments have been illustrated and described herein, it will be appreciated by those skilled in the art that any arrangement which is calculated to achieve the same purpose may be substituted for the specific embodiment of the present invention. This application is intended to cover any adaptations or variations of the present invention.

What is claimed is:

1. A phase-locked loop comprising:

a phase detector responsive to an input signal and a feed-back signal and providing first and second outputs;

a loop filter coupled to the phase detector for receiving and filtering an output signal from the phase detector, wherein the loop filter comprises an amplifier and first and second filter circuits, wherein each of the first and second filter circuits includes:

a first filter section coupled to one of the first and second outputs of the phase detector;

a second filter section coupled to the first filter section via an interconnecting resistor, wherein the resistor has a pair of oppositely poled diodes in parallel across the resistor for effecting bandwidth characteristics of the loop filter such that the loop filter operates at a wide bandwidth during an acquisition mode of operation and the loop filter operates at a predetermined narrow bandwidth in a locked mode of operation;

the amplifier having inputs coupled to each of the second filter sections of the first and second filter circuits; and a voltage controlled oscillator for receiving a direct current output signal from the amplifier of the loop filter and for providing the feed-back signal.

2. The phase-locked loop of claim 1 wherein each first filter section comprises a first resistor and a first capacitor serially interconnected between an output of the phase detector and a ground.

3. The phase-locked loop of claim 1 wherein each second filter section comprises the interconnecting resistor, a second capacitor and a third resistor serially interconnected to a node located on the first filter section and to ground.

4. The phase-locked loop of claim 1 wherein the input signal is an analog signal.

5. The phase-locked loop of claim 1 wherein the input signal is a digital signal.

6. A phase-locked loop comprising:

a phase detector responsive to an input signal and a feed-back signal and having first and second output signals;

a loop filter coupled to the phase detector for receiving and filtering the first and second output signals from the phase detector;

wherein the loop filter comprises first and second filter circuits coupled to an amplifier;

wherein the first and second filter circuits each include first and second filter sections that operate the loop filter at a wide bandwidth during an acquisition mode of operation and at a predetermined narrow bandwidth in a locked mode of operation; and a voltage controlled oscillator for receiving a direct current output signal from the loop filter and for providing the feed-back signal.

7. The phase-locked loop of claim 6 wherein each second filter section comprises an interconnecting circuit having a pair of oppositely poled diodes in parallel across a resistor for effecting bandwidth characteristics of the loop filter.

8. The phase-locked loop of claim 7 wherein each second filter section comprises the interconnecting circuit, a second capacitor and a third resistor serially interconnected to a node located on the first filter section and to ground.

9. The phase-locked loop of claim 6 wherein each first filter section comprises a first resistor and a first capacitor serially interconnected between an output of the phase detector and a ground.

10. The phase-locked loop of claim 6 wherein one of the diodesis conducting during the acquisition mode of operation.

11. The phase-locked loop of claim 6 wherein the input signal is an analog signal.

12. The phase-locked loop of claim 6 wherein the input signal is a digital signal.

13. A digital communication system comprising:

a receiver for receiving an input signal;

a recovery unit for separating a clock signal and a data signal from the input signal;

a phase-locked loop for receiving the clock signal, wherein the phase-locked loop comprises:
1) a phase detector responsive to an input signal and a feed-back signal and providing first and second outputs;
2) a loop filter coupled to the phase detector for receiving and filtering jitter from an output signal from the phase detector, wherein the loop filter comprises an amplifier and first and second filter circuits, wherein each of the first and second filter circuits includes:
   I) a first filter section coupled to one of the first and second outputs of the phase detector;
   ii) a second filter section coupled to the first filter section via an interconnecting resistor, wherein the resistor has a pair of oppositely poled diodes in parallel across the resistor for effecting bandwidth characteristics of the loop filter such that the loop filter operates at a wide bandwidth during an acquisition mode of operation and the loop filter operates at a predetermined narrow bandwidth in a locked mode of operation;
3) the amplifier having inputs coupled to each of the second filter sections of the first and second filter circuits;
4) a voltage controlled oscillator for receiving a DC output signal from the amplifier of the loop filter and for providing the feed-back signal; and a transmitter for receiving an output clock signal from the phase-locked loop wherein jitter has been removed from the clock signal.

14. The system of claim 13 wherein each first filter section comprises a first resistor and a first capacitor serially interconnected between an output of the phase detector and a ground.

15. The system of claim 13 wherein each second filter section includes the interconnecting resistor, a second capacitor and a third resistor serially interconnected to a node located on the first filter section and to ground.

* * * * *